United States Patent
Ikeda

(10) Patent No.: US 10,658,356 B2
(45) Date of Patent: May 19, 2020

(54) SEMICONDUCTOR DEVICE AND SEMICONDUCTOR PACKAGE

(71) Applicant: Kabushiki Kaisha Toshiba, Minato-ku (JP)

(72) Inventor: Kentaro Ikeda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/114,780

(22) Filed: Aug. 28, 2018

(65) Prior Publication Data

US 2019/0296008 A1    Sep. 26, 2019

(30) Foreign Application Priority Data

Mar. 22, 2018 (JP) ................. 2018-054116

(51) Int. Cl.
*H01L 27/06* (2006.01)
*H03K 17/081* (2006.01)
(Continued)

(52) U.S. Cl.
CPC ...... *H01L 27/0629* (2013.01); *H01L 23/5286* (2013.01); *H01L 24/49* (2013.01); *H01L 29/2003* (2013.01); *H03K 17/08104* (2013.01)

(58) Field of Classification Search
CPC ....... H01L 27/12; H01L 27/124; H01L 29/78; H01L 29/861; H01L 25/50; H01L 25/16; H01L 27/04
(Continued)

(56) References Cited

U.S. PATENT DOCUMENTS 4,394,590 A * 7/1983 Honda ............... H03K 17/6871
  327/436
6,847,174 B2 * 1/2005 Franck .................... H02M 1/38
  315/209 R
(Continued)

FOREIGN PATENT DOCUMENTS

JP   2009-22106   1/2009
JP   2014-187726  10/2014
(Continued)

*Primary Examiner* — John W Poos
(74) *Attorney, Agent, or Firm* — Oblon, McClelland, Maier & Neustadt, L.L.P.

(57) ABSTRACT

A semiconductor device according to an embodiment is a semiconductor device including: a normally-off transistor having a first source, a first drain, and a first gate; a normally-on transistor having a second source electrically connected to the first drain, a second drain, and a second gate; a first capacitor having a first end and a second end, the second end electrically connected to the second gate; a first diode having a first anode electrically connected between the second end and the second gate, and a first cathode; a first resistor electrically connected between the first end and the first gate; a second diode having a second anode electrically connected to the first end, and a second cathode electrically connected to the first gate, the second diode provided in parallel to the first resistor; a gate drive circuit electrically connected to the first resistor and the second anode, a reference potential wiring being connected to the gate drive circuit and the first source; and a second capacitor having a third end and a fourth end, the third end electrically connected to the reference potential wiring and the fourth end electrically connected to the second source.

11 Claims, 9 Drawing Sheets

(51) Int. Cl.
*H01L 29/20* (2006.01)
*H01L 23/00* (2006.01)
*H01L 23/528* (2006.01)

(58) Field of Classification Search
USPC .................. 327/108, 109, 110, 111, 112
See application file for complete search history.

(56) References Cited

U.S. PATENT DOCUMENTS

| | | |
|---|---|---|
| 8,018,255 B2 | 9/2011 | Hirao et al. |
| 9,142,544 B2 | 9/2015 | Ikeda |
| 9,653,449 B2 | 5/2017 | Ikeda |
| 2013/0033243 A1 | 2/2013 | Takemae |
| 2014/0284662 A1* | 9/2014 | Ikeda .................. H01L 27/0255 |
| | | 257/195 |
| 2015/0357321 A1 | 12/2015 | Ikeda |
| 2018/0013415 A1 | 1/2018 | Ikeda et al. |

FOREIGN PATENT DOCUMENTS

| | | |
|---|---|---|
| JP | 5794855 | 10/2015 |
| JP | WO 2017/009990 A1 | 1/2017 |
| JP | WO 2017/010554 A1 | 1/2017 |
| JP | 6392458 B2 | 9/2018 |

* cited by examiner

SEMICONDUCTOR DEVICE AND SEMICONDUCTOR PACKAGE

CROSS-REFERENCE TO RELATED APPLICATION

This application is based upon and claims the benefit of priority from Japanese Patent Application 2018-054116, filed on Mar. 22, 2018, the entire contents of which are incorporated herein by reference.

FIELD

Embodiments described herein relate generally to a semiconductor device and a semiconductor package.

BACKGROUND

Group III nitrides, for example, GaN (gallium nitride) based semiconductors have been expected as materials for next-generation power semiconductor devices. A GaN-based semiconductor has a wider band gap as compared with Si (silicon). For this reason, as compared with Si (silicon) semiconductor devices, GaN-based semiconductor devices can achieve small-size and high-withstand voltage power semiconductor devices. In addition, the parasitic capacitance can be reduced accordingly, and high-speed driven power semiconductor devices can be thus achieved.

Generally, a high electron mobility transistor (HEMT) structure with a two-dimensional electron gas (2DEG) as a carrier is applied to GaN-based transistors. A typical HEMT is a normally-on transistor which provides conduction without applying a voltage to the gate. For this reason, there is a problem that it is difficult to achieve a normally-off transistor which provides no conduction unless a voltage is applied to the gate. For power supply circuits and the like which handle large amounts of electric power from several hundred V to 1000 V, the operation of normally off is required with emphasis on safety. Therefore, a circuit configuration has been proposed which achieves a normally-off operation with a cascode connection between a normally-on GaN-based transistor and a normally-off Si transistor.

In addition, in the case of a circuit configuration in which a main circuit current flowing between a drain and a source and a driving current flowing between a gate and the source share a source inductance, the driving current is also modulated due to the electromotive force generated on the source inductance with temporal changes in main circuit current. The delay such as the decreased speed of activating or deactivating the power semiconductor device, and the ringing of sharply changing the drain current or the source voltage with time have been problematic, which are caused accordingly. Therefore, a circuit configuration that uses a Kelvin connection has been proposed, in which a main circuit current and a gate driving current share no source inductance.

DETAILED DESCRIPTION

Figure 1:
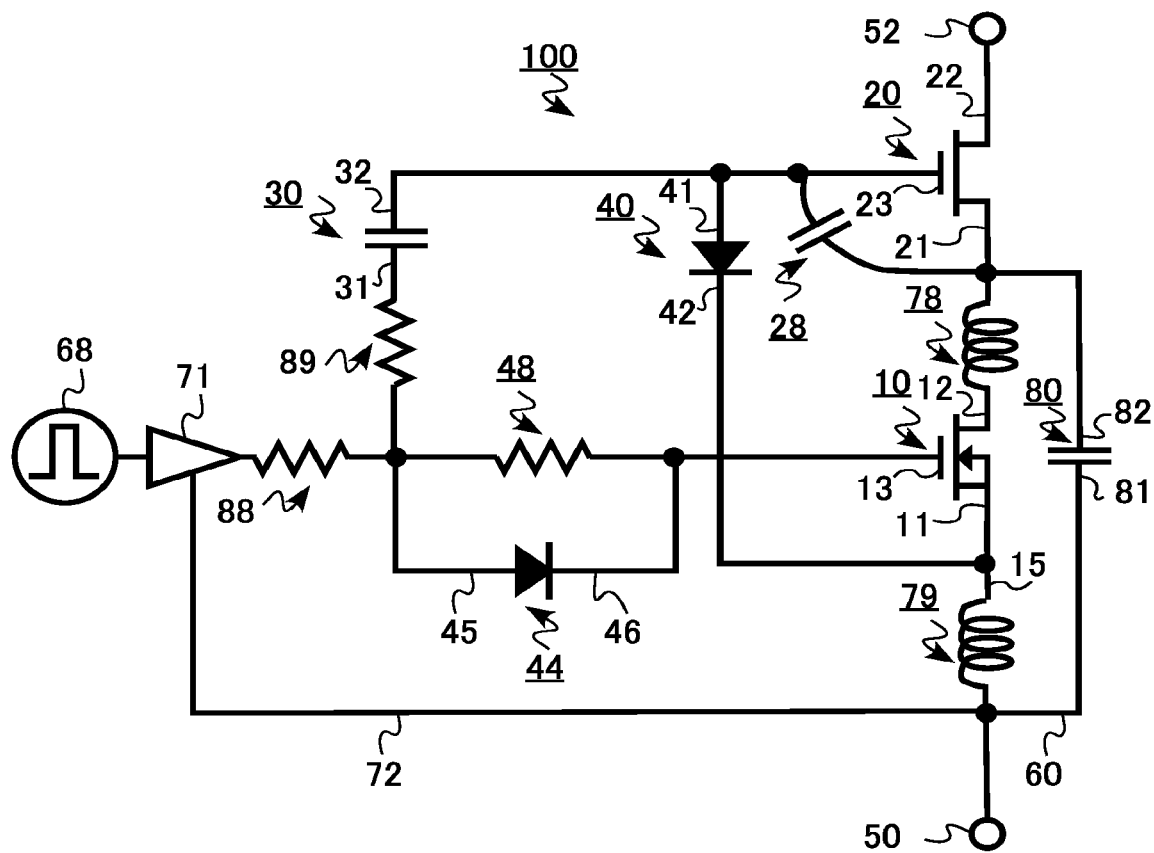
FIG. 1 is a circuit diagram of a semiconductor device according to a first embodiment.

A semiconductor device according to an embodiment is a semiconductor device including: a normally-off transistor having a first source, a first drain, and a first gate; a normally-on transistor having a second source electrically connected to the first drain, a second drain, and a second gate; a first capacitor having a first end and a second end, the second end electrically connected to the second gate; a first diode having a first anode electrically connected between the second end and the second gate, and a first cathode; a first resistor electrically connected between the first end and the first gate; a second diode having a second anode electrically connected to the first end, and a second cathode electrically connected to the first gate, the second diode provided in parallel to the first resistor; a gate drive circuit electrically connected to the first resistor and the second anode, a reference potential wiring being connected to the gate drive circuit and the first source; and a second capacitor having a third end and a fourth end, the third end electrically connected to the reference potential wiring and the fourth end electrically connected to the second source.

Hereinafter, embodiments of the present disclosure will be described with reference to the drawings. It is to be noted that in the following description, the same or similar members may be denoted by the same reference numerals in some cases. In addition, the description of the members or the like once described may be omitted as appropriate.

In addition, in this specification, a semiconductor device has a concept that encompasses a power module with a plurality of elements such as discrete semiconductors combined, or an intelligent power module with a plurality of elements such as discrete semiconductors in which a drive circuit for driving the elements or a self-protection function is built, or the whole system provided with the power module and the intelligent power module.

In addition, in this specification, the term "GaN-based semiconductor" is a generic term for semiconductors that have GaN (gallium nitride), AlN (aluminum nitride), InN (indium nitride), and intermediate compositions thereof.

First Embodiment

The semiconductor device according to the present embodiment is a semiconductor device including: a normally-off transistor having a first source, a first drain, and a first gate; a normally-on transistor having a second source electrically connected to the first drain, a second drain, and a second gate; a first capacitor having a first end and a second end, the second end electrically connected to the second gate; a first diode having a first anode electrically connected between the second end and the second gate, and a first cathode; a first resistor electrically connected between the first end and the first gate; a second diode having a second anode electrically connected to the first end, and a second cathode electrically connected to the first gate, the second diode provided in parallel to the first resistor; a gate drive circuit electrically connected to the first resistor and the second anode, a reference potential wiring being connected to the gate drive circuit and the first source; and a second capacitor having a third end and a fourth end, the third end electrically connected to the reference potential wiring and the fourth end electrically connected to the second source.

Further, a line parallel to a first outer edge of the first wiring passes through the gate drive circuit reference potential line, or a line parallel to a third outer edge of the gate drive circuit reference potential line passes through the first wiring.

FIG. 1 is a circuit diagram of a semiconductor device 100 according to the present embodiment. The semiconductor device 100 according to the present embodiment serves as, for example, a power module that has a rated voltage of 600 V or 1200 V.

The semiconductor device 100 according to the present embodiment includes a normally-off transistor 10, a normally-on transistor 20, a first capacitor 30, a first diode 40, a first resistor 48, a second diode 44, a gate drive circuit 71, a second capacitor 80, a signal source 68, a source terminal 50, and a drain terminal 52.

The normally-off transistor 10 has a first source 11, a first drain 12, and a first gate 13.

The normally-off transistor 10 is a transistor through which no drain current flows when no voltage is applied to the gate. The normally-off transistor 10 is, for example, a vertical metal oxide semiconductor field effect transistor (MOSFET) that uses a Si (silicon) semiconductor. It is to be noted that the normally-off transistor 10 includes a parasitic body diode, not shown. The withstand voltage of the normally-off transistor 10 is, for example, 10 V or higher and 30 V or lower.

The normally-on transistor 20 has a second source 21, a second drain 22, and a second gate 23. The second source 21 is electrically connected to the first drain 12.

The normally-on transistor 20 is a transistor through which a drain current flows even when no voltage is applied to the gate. The normally-on transistor 20 is, for example, a HEMT that uses a GaN (gallium nitride) based semiconductor.

The withstand voltage of the normally-on transistor 20 is higher than the withstand voltage of the normally-off transistor 10. The withstand voltage of the normally-on transistor 20 is, for example, 600 V or higher and 1200 V or lower.

The semiconductor device 100 according to the present embodiment has a circuit configuration that achieves a normally-off operation with a so-called cascode connection of a direct connection between the normally-off transistor 10 and the normally-on transistor 20.

The first source 11 is electrically connected to the first source terminal (source terminal) 50. The second drain 22 is electrically connected to the drain terminal 52.

A first inductance 78 serves as a source inductance of the normally-on transistor 20. A second inductance 79 serves as a source inductance of the normally-off transistor 10.

The main circuit current flowing between the drain and the source flows through the drain terminal 52, the normally-on transistor 20, the first inductance 78, the normally-off transistor 10, the second inductance 79, and the source terminal 50. A main circuit wiring 15 serves as a wiring through which the main circuit current flows.

A parasitic capacitance 28 serves as the gate-source parasitic capacitance of the normally-on transistor 20.

The first capacitor 30 has a first end 31 and a second end 32. The second end 32 is electrically connected to the second gate 23.

The first diode 40 has a first anode 41 and a first cathode 42. The first anode 41 is electrically connected between the second end 32 and the second gate 23.

In the semiconductor device 100 shown in FIG. 1, the first cathode 42 is electrically connected to the first source 11.

The first resistor 48 is electrically connected between the first end 31 and the first gate 13.

The second diode 44 has a second anode 45 and a second cathode 46. The second anode 45 is electrically connected to the first end 31. The second cathode 46 is electrically connected to the first gate 13. The second diode 44 is provided in parallel to the first resistor 48.

The signal source 68 outputs a signal such as a square wave, for example.

The gate drive circuit 71 outputs signals for driving the normally-off transistor 10 and the normally-on transistor 20 on the basis of the signal output from the signal source 68.

The gate drive circuit 71 may be, for example, an IC with a plurality of elements integrated as one chip, or an electronic circuit board with a plurality of electronic components disposed.

The reference potential of the gate drive circuit 71 is electrically connected to the first source 11 through the use of the gate drive circuit reference potential line 72 connected to the gate drive circuit 71. It is to be noted that the gate drive circuit reference potential line 72 is an example of the third wiring.

The fourth resistor 88 and the fifth resistor 89 serve as gate resistors.

The second capacitor 80 has a third end 81 and a fourth end 82. The third end 81 is electrically connected to the gate drive circuit reference potential line 72 through the use of the first wiring 60. The fourth end 82 is electrically connected to the second source 21.

The capacitance of the second capacitor 80 is preferably equal to or higher than the capacitance of the first capacitor 30.

FIGS. 2A to 2D are schematic diagrams showing examples of how the gate drive circuit reference potential line 72 and the first wiring 60 are connected in the semiconductor device 100 according to the present embodiment. It is to be noted that the main circuit wiring 15 is shown together.

FIGS. 2A to 2D are schematic diagrams assuming a case, for example, where the first wiring 60, the gate drive circuit reference potential line 72, and the main circuit wiring 15 are formed on a printed circuit board, not shown.

The displacement current passing through the second capacitor 80 flows from the first wiring 60 through a part of the main circuit wiring 15 to the gate drive circuit reference potential line 72.

In the case described above, any one of a line parallel to a first outer edge 61 of the first wiring 60 and passing through the first wiring 60 and a line parallel to a second outer edge 62 of the first wiring 60 and passing through the first wiring 60 preferably passes through the main circuit wiring 15 and passes through the gate drive circuit reference potential line 72. Alternatively, any one of a line parallel to a third outer edge (second outer edge) 73 of the gate drive circuit reference potential line 72 and passing through the gate drive circuit reference potential line 72 and a line parallel to a fourth outer edge 74 of the gate drive circuit reference potential line 72 and passing through the gate drive circuit reference potential line 72 preferably passes through the main circuit wiring 15 and passes through the first wiring 60.

Figure 2A:
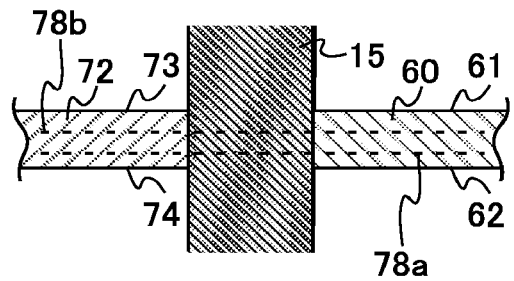
FIGS. 2A to 2D are schematic diagrams showing examples of how a gate drive circuit reference potential line and a first wiring are connected in the semiconductor device according to the first embodiment.

FIG. 2A is a schematic diagram showing a preferred example of how the gate drive circuit reference potential line 72 and the first wiring 60 are connected in the semiconductor device 100 according to the present embodiment. A line 78a parallel to the first outer edge 61 and the second outer edge 62 and passing through the first wiring 60, as indicated by a dotted line, passes through the main circuit wiring 15 and passes through the gate drive circuit reference potential line 72. In addition, a line 78b parallel to the third outer edge 73 and the fourth outer edge 74 and passing through the gate drive circuit reference potential line 72, as indicated by a dotted line, passes through the main circuit wiring 15 and passes through the first wiring 60. It is to be noted that the line 78a and the line 78b can be identical lines in FIG. 2A.

Figure 2B:
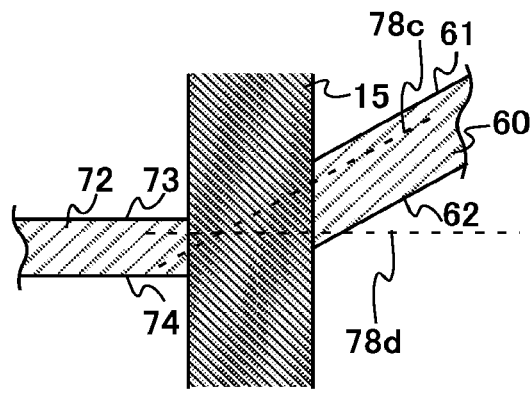

FIG. 2B is also a schematic diagram showing a preferred example of how the gate drive circuit reference potential line 72 and the first wiring 60 are connected. A line 78c parallel to the first outer edge 61 and the second outer edge 62 and passing through the first wiring 60, as indicated by a dotted line, passes through the main circuit wiring 15 and passes through the gate drive circuit reference potential line 72. In addition, a line 78d parallel to the third outer edge 73 and the fourth outer edge 74 and passing through the gate drive circuit reference potential line 72 passes through the main circuit wiring 15 and passes through the first wiring 60.

Figure 2C:
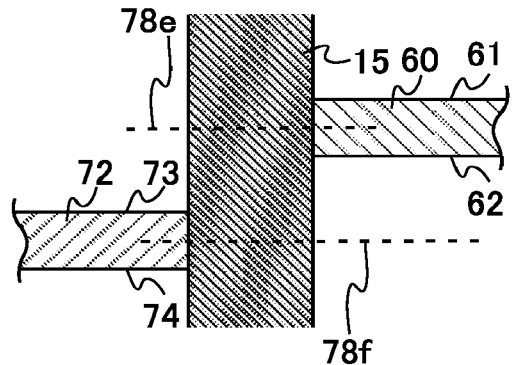

The example shown in FIG. 2C is a diagram as a comparative embodiment. A line 78e parallel to the first outer edge 61 and the second outer edge 62 and passing through the first wiring does not pass through the gate drive circuit reference potential line 72. In addition, a line 78f parallel to the third outer edge 73 and the fourth outer edge 74 and passing through the gate drive circuit reference potential line 72 does not pass through the first wiring.

Figure 2D:
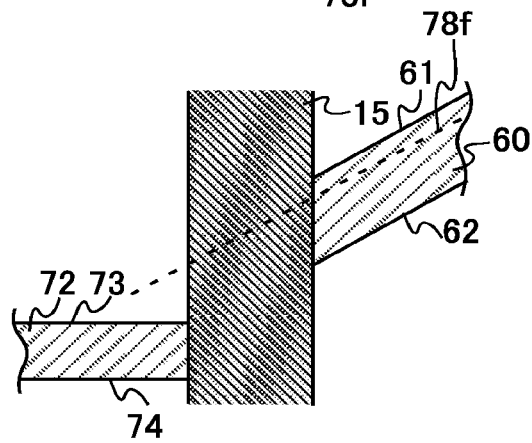

The example shown in FIG. 2D is a diagram as a comparative embodiment. A line 78f parallel to the first outer edge 61 and the second outer edge 62 and passing through the first wiring passes through a part where no wiring is formed before passing through the gate drive circuit reference potential line 72, which is not preferable.

Next, the operation of the semiconductor device 100 according to the present embodiment will be described.

For example, the signal source 68 and the gate drive circuit 71 are used to output a square wave that goes back and forth between 0 V and a finite voltage $V_a$ capable of turning on the normally-off transistor 10.

When $V_a$ is input to the first gate 13, the normally-off transistor 10 is turned on. In addition, when 0 V is input to the first gate 13, the normally-off transistor 10 is turned off.

When $V_a$ is output from the gate drive circuit 71, a current flows from the first capacitor 30 through the first diode 40 to the source terminal 50. A voltage corresponding to the forward voltage $V_F$ of the first diode 40 is input to the second gate 23. Accordingly, the normally-on transistor 20 is turned on. On the other hand, when 0 V is output from the gate drive circuit 71, a current flows from the parasitic capacitance 28 to the first capacitor 30. A negative voltage ($V_F$–$V_a$) corresponding to the difference between $V_F$ and $V_a$ is input to the second gate 23. Accordingly, the normally-on transistor 20 is turned off.

In this regard, when the semiconductor device 100 is turned from off to on, the normally-off transistor 10 is desirably turned on earlier than the normally-on transistor 20. This is because if the normally-on transistor 20 is turned on earlier, a high voltage will be applied to the connection between the first drain 12 and the second source 21, and there is thus a possibility of degrading the characteristics of the normally-off transistor 10 which is low in withstand voltage.

In the semiconductor device 100 according to the present embodiment, a current flows through the second diode 44 provided in parallel with the first resistor 48 when the semiconductor device is turned from an off state to an on state. For this reason, charging the first gate 13 is not affected by the first resistor 48. Accordingly, the first gate 13 can be quickly charged. Therefore, when the semiconductor device is turned from the off state to the on state, the normally-off transistor 10 is allowed to be reliably turned on earlier than the normally-on transistor 20.

In addition, providing the first resistor 48 can delay the off timing of the normally-off transistor 10 and the off timing of the normally-on transistor 20 by desired periods of time. Accordingly, when the semiconductor device is turned from the on state to the off state, the normally-on transistor 20 is allowed to be turned off earlier than the normally-off transistor 10.

Next, operational effects of the semiconductor device 100 according to the present embodiment will be described.

As in the semiconductor device according to the present embodiment, a normally-off transistor comprising a first source, a first drain, and a first gate; a normally-on transistor comprising a second source electrically connected to the first drain, a second drain, and a second gate; a first capacitor comprising a first end and a second end, the second end electrically connected to the second gate; a first diode comprising a first anode electrically connected between the second end and the second gate, and a first cathode; a first resistor electrically connected between the first end and the first gate; a second diode comprising a second anode electrically connected to the first end, and a second cathode electrically connected to the first gate, the second diode provided in parallel to the first resistor; a gate drive circuit electrically connected to the first resistor and the second anode, wherein a reference potential of the gate drive circuit is electrically connected to the first source by using a third wiring connected to the gate drive circuit; and a second capacitor comprising a third end and a fourth end, with the third end electrically connected to the third wiring by using a first wiring and the fourth end electrically connected to the second source are included, thereby making it possible to provide a semiconductor device in which the normally-off transistor and the normally-on transistor are cascode-connected, with delay and ringing suppressed. In the case of a Kelvin connection of the normally-on transistor 20, it is conceivable, for example, to electrically connect the second source 21 directly to the source terminal 50 by wiring or the like. However, in this case, a path is formed through which the main circuit current flows from the drain terminal 52 via only the normally-on transistor 20 to the source terminal 50 without passing through the normally-off transistor 10, and the semiconductor device 100 thus has the problem of failing to function as a cascode-connected circuit.

The semiconductor device 100 according to the present embodiment includes the second capacitor 80 with the third end 81 and the fourth end portion 82, where the third end 81 is electrically connected to the gate drive circuit reference potential line 72, whereas the fourth end 82 is electrically connected to the second source 21. In other words, the normally-on transistor 20 is connected to the source terminal 50 in an alternate-current manner with the use of the second capacitor 80.

Thus, the main circuit current flows through the normally-off transistor 10 and the normally-on transistor 20. Furthermore, a transiently generated current flows through the second capacitor 80 to the source terminal 50 without flowing through the second inductance 79. More specifically, the effect of the Kelvin connection will be obtained for the transiently generated current. This makes it possible to provide the semiconductor device 100 in which the normally-off transistor and the normally-on transistor are cascode-connected, with delay and ringing suppressed.

Figure 3:
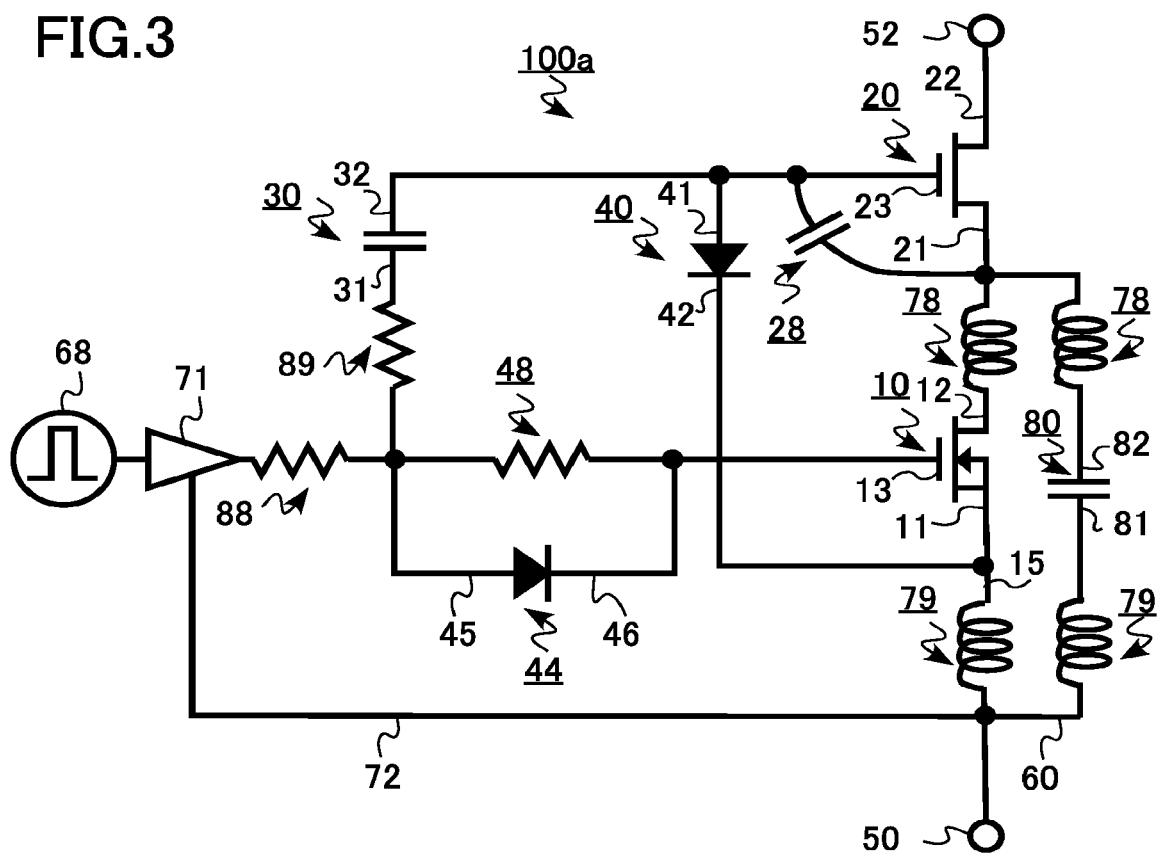
FIG. 3 is a schematic diagram showing an operational effect of the semiconductor device according to the first embodiment.

FIG. 3 is a schematic diagram showing an operational effect of the semiconductor device 100 according to the present embodiment. In other words, FIG. 3 is a schematic diagram of a circuit of a semiconductor device 100a for examining the operation of the semiconductor device 100 according to the present embodiment. A first inductance 78 is electrically connected between the second capacitor 80 and the second source 21. Furthermore, a second inductance 79 is electrically connected between the second capacitor 80 and the source terminal 50. In other words, the source inductance of a path through which the main circuit current flows and the inductance of the path of a current flowing through the second capacitor 80 are adapted to be identical.

Figure 4:
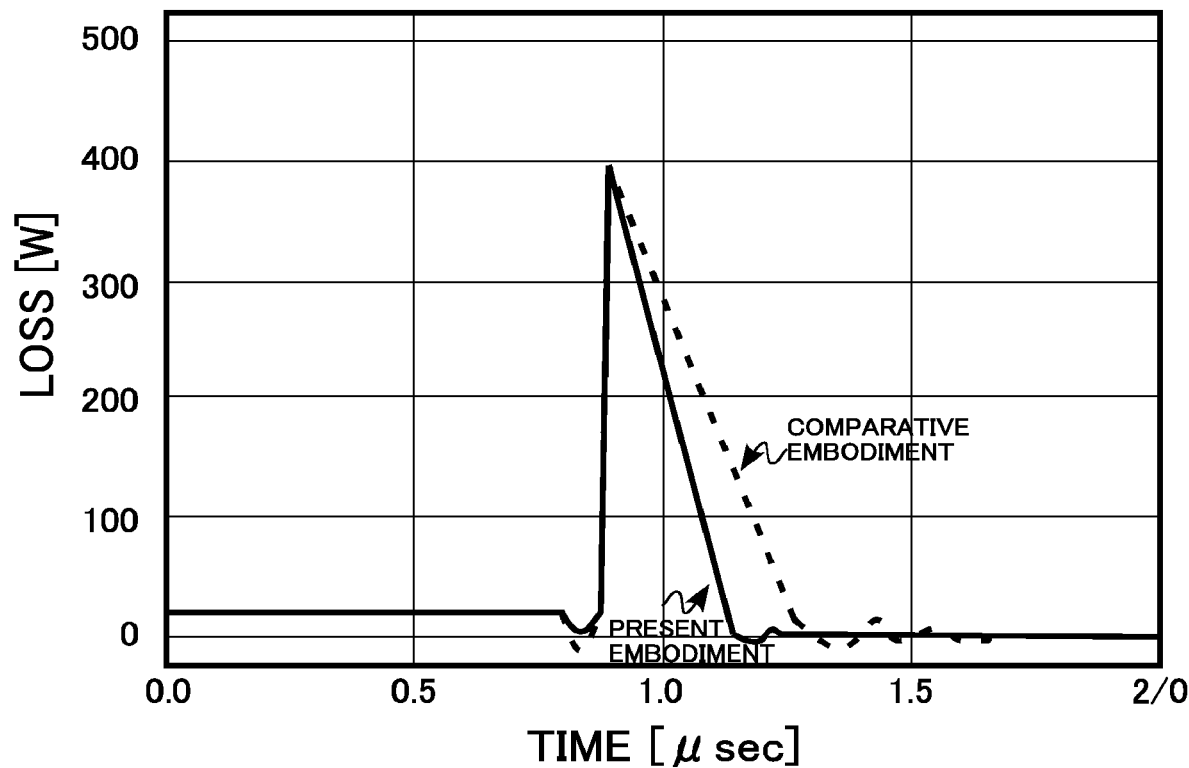
FIG. 4 is a schematic diagram showing an operational effect of the semiconductor device according to the first embodiment.

FIG. 4 is a schematic diagram showing an operational effect of the semiconductor device 100 according to the present embodiment. In other words, the solid line in FIG. 4 indicates loss energy in switching the transistors in the circuit shown in FIG. 3. In addition, the dotted line in FIG. 4 indicates loss energy in switching the transistors in the semiconductor device according to the comparative embodiment, which is not provided with any path through the second capacitor 80.

As shown in FIG. 4, in the semiconductor device according to the present embodiment, the loss produced in the circuit disappears more rapidly than in the semiconductor device according to the comparative embodiment. When the loss on the vertical axis is integrated with respect to time, the energy of the loss produced is calculated. The energy of the loss produced in the semiconductor device according to the comparative embodiment was 71.1 μJ, whereas the energy of the loss in the semiconductor device according to the present embodiment was 38.9 μJ. Therefore, it has been made clear that the switching loss is reduced by the semiconductor device according to the present embodiment.

It is to be noted that in the semiconductor device shown in FIG. 3, the source inductance of the path through which the main circuit current flows and the inductance of the path of the current flowing through the second capacitor 80 are adapted to be identical as described above. Therefore, the switching loss is considered further reduced by making the inductance of the path through the second capacitor 80 lower than the inductance of the path through which the main circuit current flows.

Any one of a line parallel to the first outer edge 61 of the first wiring 60 and passing through the first wiring 60 and a line parallel to the second outer edge 62 of the first wiring 60 and passing through the first wiring 60 preferably passes through the main circuit wiring 15 and passes through the gate drive circuit reference potential line 72. Alternatively, any one of a line parallel to a third outer edge (second outer edge) 73 of the gate drive circuit reference potential line 72 and passing through the gate drive circuit reference potential line 72 and a line parallel to a fourth outer edge 74 of the gate drive circuit reference potential line 72 and passing through the gate drive circuit reference potential line 72 preferably passes through the main circuit wiring 15 and passes through the first wiring 60. The reason is that the foregoing makes the current flowing through the second capacitor 80 more likely to flow directly into the gate drive circuit reference potential line 72. Therefore, it is possible to bypass the source inductance of the normally-off transistor 10, thereby causing the normally-on transistor 20 to make a more favorable Kelvin connection.

The fact that the capacitance of the second capacitor 80 is equal to or higher than the capacitance of the first capacitor 30 is preferred for causing the charge stored in the first capacitor 30 to flow quickly from the second capacitor 80 to the source terminal 50, and thus suppressing delay and ringing of the normally-on transistor 20.

As just described, the semiconductor device according to the present embodiment makes it possible to provide a semiconductor device in which a normally-off transistor and a normally-on transistor are cascode-connected, with delay and ringing suppressed.

Second Embodiment

The semiconductor device according to the present embodiment is different from the first embodiment in that a third end 81 is electrically connected directly to a gate drive circuit reference potential line 72 without any main circuit wiring 15 interposed therebetween. In this regard, descriptions of contents that overlap with the first embodiment will be omitted.

Figure 5:
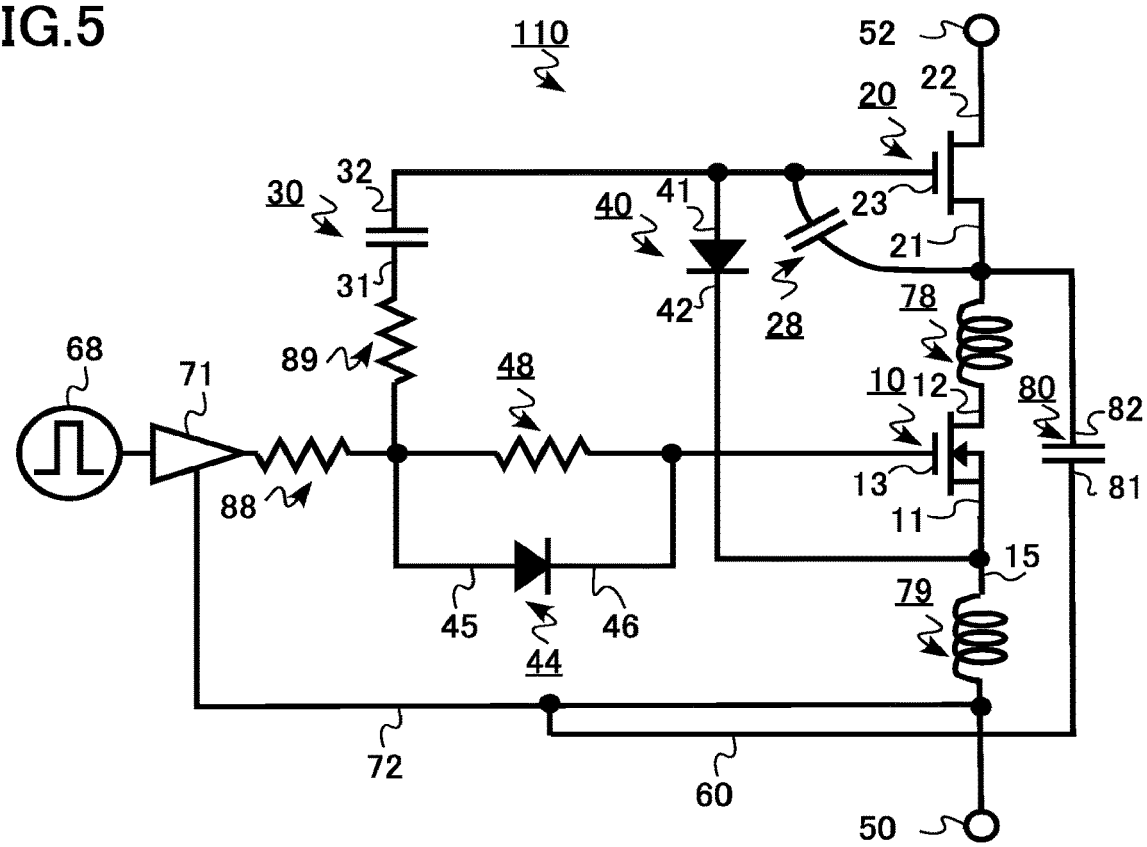
FIG. 5 is a circuit diagram of a semiconductor device according to a second embodiment.

FIG. 5 is a circuit diagram of a semiconductor device 110 according to the present embodiment.

The third end 81 is connected directly to the gate drive circuit reference potential line 72 with the use of a first wiring 60, without any main circuit wiring 15 interposed therebetween, thus making it possible to achieve a Kelvin connection with the reduced influence of the main circuit current flowing through the main circuit wiring 15. Therefore, delay and ringing are further suppressed.

The semiconductor device according to the present embodiment makes it possible to provide a semiconductor device in which a normally-off transistor and a normally-on transistor are cascode-connected, with delay and ringing suppressed.

Third Embodiment

The semiconductor device according to the present embodiment is different from the semiconductor device according to the first embodiment in that a second resistor 70 electrically connected between a gate drive circuit reference potential line 72 and a third end 81 is further provided. In this regard, descriptions of contents that overlap with the first embodiment will be omitted.

Figure 6:
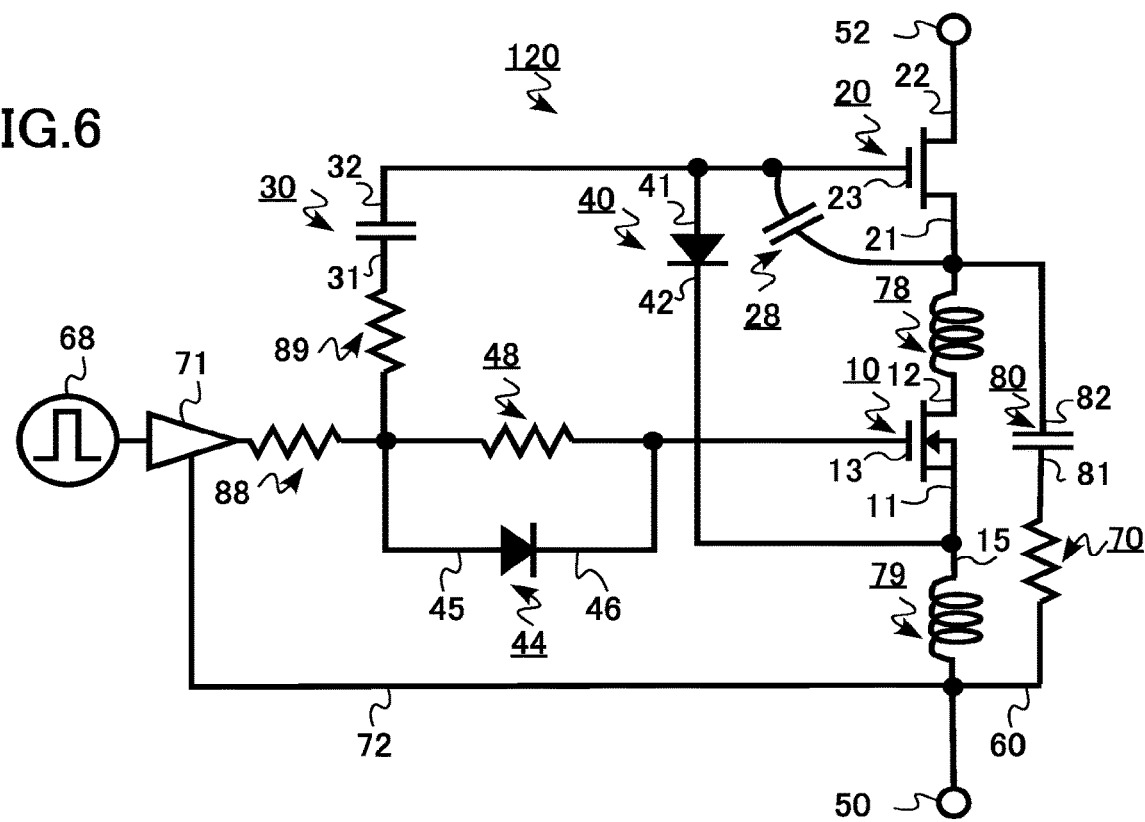
FIG. 6 is a circuit diagram of a semiconductor device according to a third embodiment.

FIG. 6 is a circuit diagram of a semiconductor device 120 according to the present embodiment.

A second capacitor 80 has a parasitic inductance, not shown. Therefore, there is the problem of resonance generation due to the capacitance of the second capacitor 80 itself and the parasitic inductance of the second capacitor 80.

Further including the second resistor 70 as in the semiconductor device 120 according to the present embodiment suppresses the resonance generation described above, thus making it possible to make a further favorable Kelvin connection.

The semiconductor device according to the present embodiment makes it possible to provide a semiconductor device in which a normally-off transistor and a normally-on transistor are cascode-connected, with delay and ringing suppressed.

Fourth Embodiment

The semiconductor device according to the present embodiment further including: a third diode with a third anode electrically connected to the second source and a third cathode electrically connected to the fourth end; a fourth diode with a fourth anode and a fourth cathode electrically connected to the second source; a third capacitor with a fifth end and a sixth end, with the fifth end electrically connected to the gate drive circuit reference potential line with the use of a second wiring and the sixth end electrically connected to the fourth anode; and a third resistor electrically connected between the gate drive circuit reference potential line and the fifth end, is different from the semiconductor device according to the second embodiment, where the fourth diode, the third capacitor, and the third resistor are provided in parallel to the third diode, the second capacitor, and the second resistor. In this regard, descriptions of respects that overlap with the first to third embodiments will be omitted.

Figure 7:
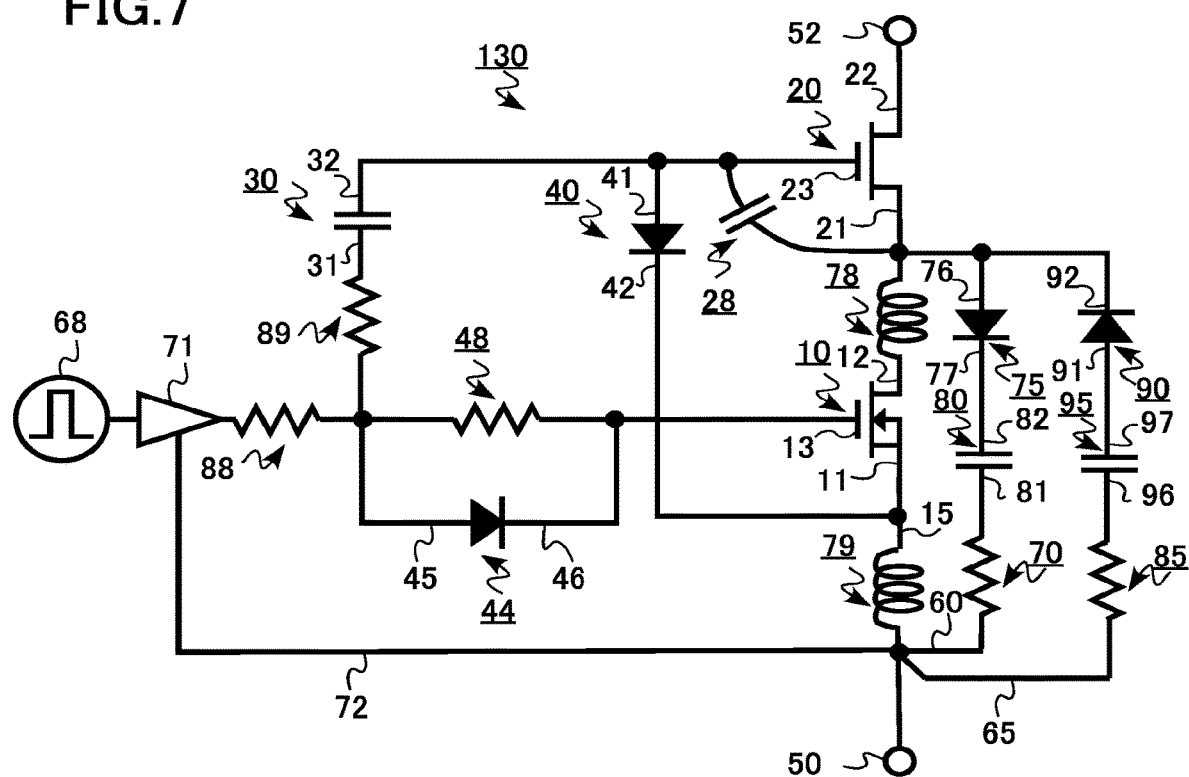
FIG. 7 is a circuit diagram according to a semiconductor device according to a fourth embodiment.

FIG. 7 is a circuit diagram of a semiconductor device 130 according to the present embodiment.

In the semiconductor device 130 according to the present embodiment, both of: a path through a third diode 75, a second capacitor 80, and a second resistor 70; and a path through a fourth diode 90, a third capacitor 95, and a third resistor 85 make a Kelvin connection of the normally-on transistor 20.

For example, a circuit design is allowed which assumes that a Kelvin connection is made by each of the path through the third diode 75 and the path through the fourth diode 90 when the normally-on transistor 20 is driven to be turned on/off. Therefore, the degree of freedom for design is increased, thereby allowing a further favorable Kelvin connection.

It is to be noted that for a favorable Kelvin connection, preferably, a line parallel to a fifth outer edge (third outer edge) of a second wiring 65 and passing through a main circuit wiring 15 and the second wiring 65 passes through the gate drive circuit reference potential line 72, or a line parallel to a sixth outer edge (fourth outer edge) of the gate drive circuit reference potential line 72 and passing through the main circuit wiring 15 and the gate drive circuit reference potential line 72 passes through the second wiring 65.

The semiconductor device according to the present embodiment makes it possible to provide a semiconductor device in which a normally-off transistor and a normally-on transistor are cascode-connected, with delay and ringing suppressed.

Fifth Embodiment

The semiconductor device according to the present embodiment is different from the first embodiment in that a first cathode 42 is electrically connected to a second source 21. In this regard, descriptions of respects that overlap with the first to fourth embodiments will be omitted.

Figure 8:
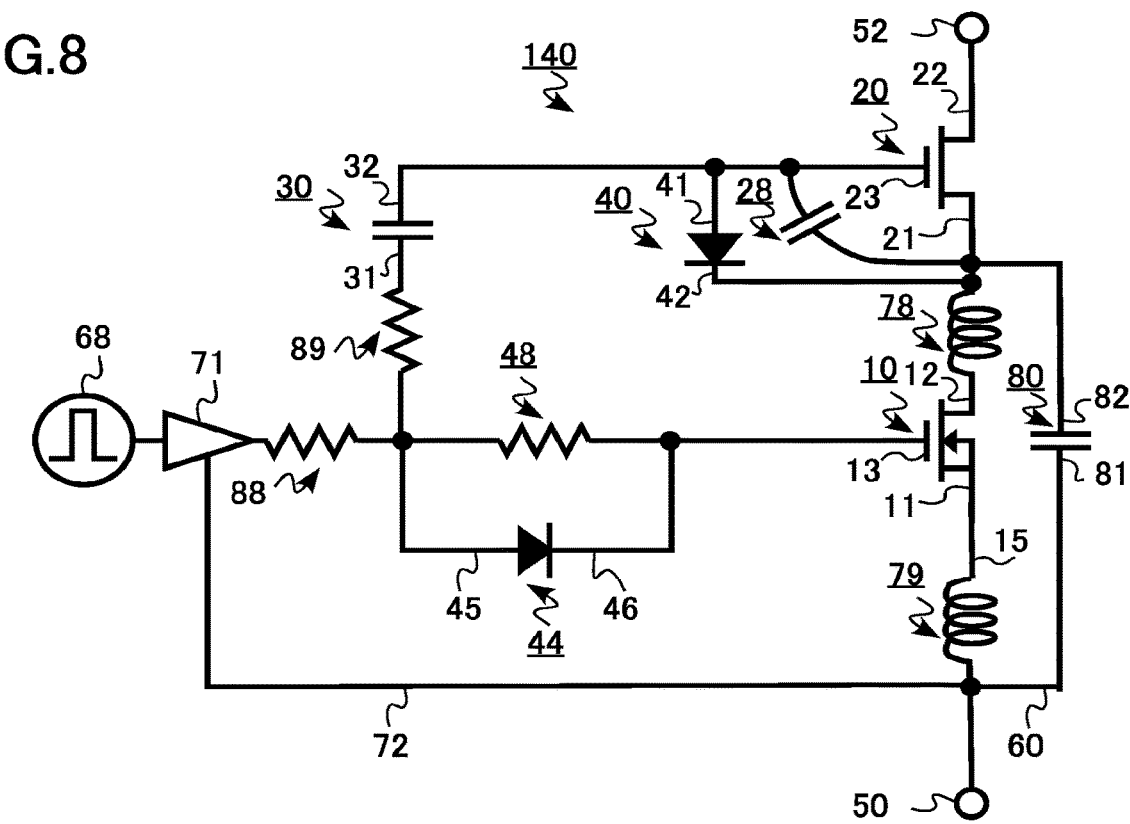
FIG. 8 is a circuit diagram of a semiconductor device according to a fifth embodiment.

FIG. 8 is a circuit diagram of a semiconductor device 140 according to the present embodiment.

Also In the semiconductor device 140 according to the present embodiment, the effect of a Kelvin connection through a second capacitor 80 is obtained with respect to a transiently generated current, as in the semiconductor devices according to the other embodiments. Thus, delay and ringing are suppressed.

The semiconductor device according to the present embodiment also makes it possible to provide a semiconductor device in which a normally-off transistor and a normally-on transistor are cascode-connected, with delay and ringing suppressed.

Sixth Embodiment

The semiconductor package according to the present embodiment is a semiconductor package including: a normally-off transistor including a first source, a first drain, and a first gate; a normally-on transistor including a second source electrically connected to the first drain, a second drain, and a second gate; a first capacitor including a first end and a second end, with the second end electrically connected to the second gate; a first diode including a first anode electrically connected between the second end and the second gate, and a first cathode; a first resistor electrically connected between the first end and the first gate; a second diode including a second anode electrically connected to the first end, and a second cathode electrically connected to the first gate, which is provided in parallel to the first resistor; a second capacitor including a third end and a fourth end, with the fourth end electrically connected to the second source; a drain terminal electrically connected to the second drain; a gate terminal electrically connected to the first end, the first resistor, and the second anode; a first source terminal electrically connected to the first source; and a second source terminal electrically connected to the third end. In this regard, descriptions of contents that overlap with the first to fifth embodiments will be omitted.

Figure 9A:
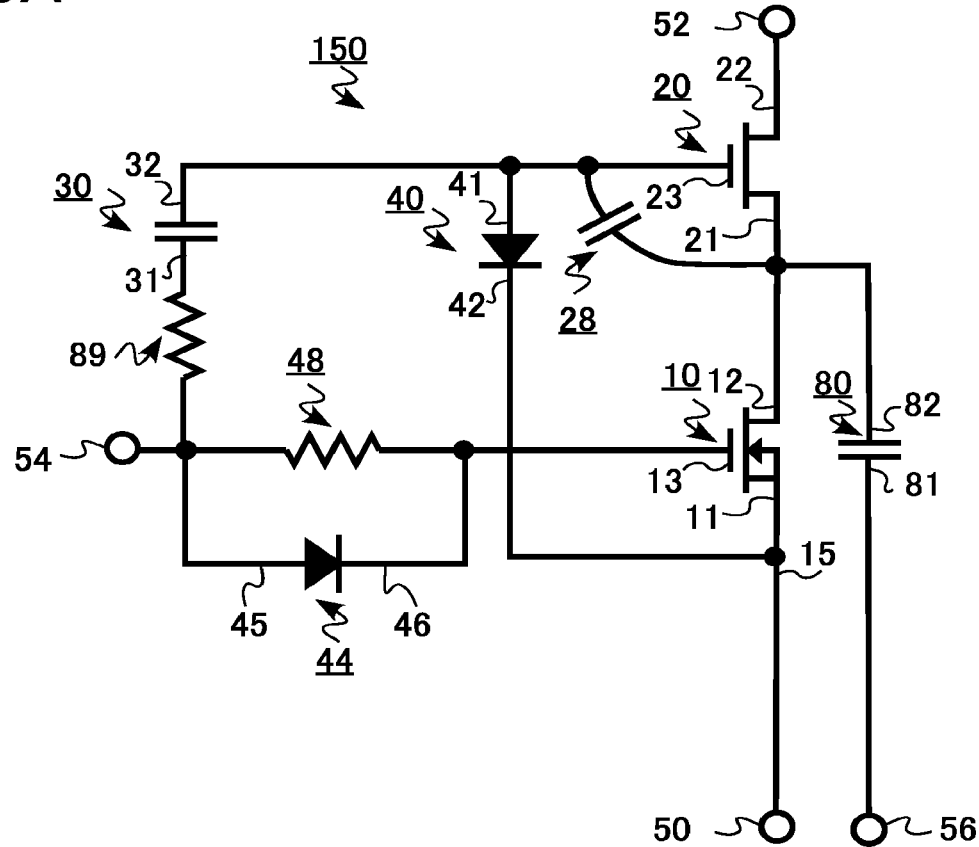
FIGS. 9A and 9B are schematic diagrams of a semiconductor package according to a sixth embodiment.
Figure 9B:
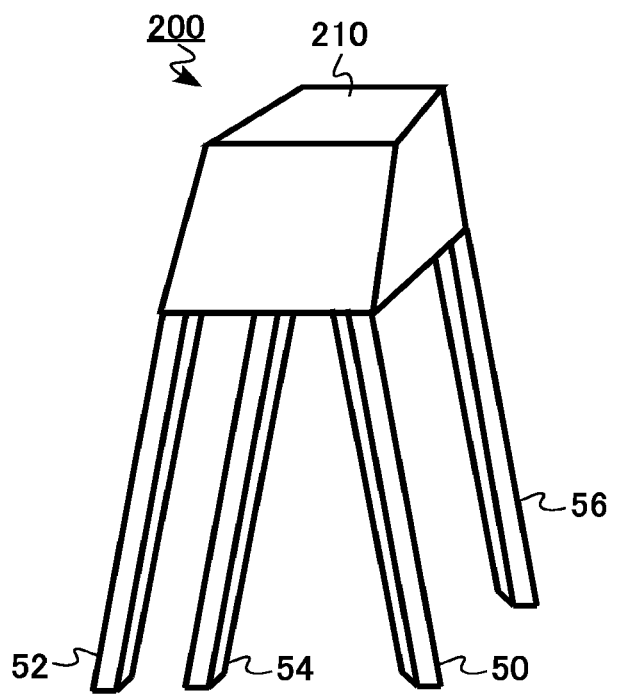

FIGS. 9A and 9B are schematic diagrams of a semiconductor package according to the present embodiment.

FIG. 9A is a circuit diagram of a semiconductor device 150 for use in the semiconductor package according to the present embodiment.

A gate terminal 54 is electrically connected to a first resistor 48, a second anode 45, and a first end 31. A drain terminal 52 is electrically connected to a second drain 22. A first source terminal 50 is electrically connected to a first source 11. A second source terminal 56 is electrically connected to a third end 81.

FIG. 9B is a schematic diagram of a semiconductor package 200 that uses the circuit diagram shown in FIG. 9A. Outside a package 210, the gate terminal 54, the drain terminal 52, the first source terminal 50, and the second source terminal 56 are provided.

The first source terminal 50 and the second source terminal 56 are physically different terminals, thus making it possible to make a favorable Kelvin connection.

The semiconductor package according to the present embodiment makes it possible to provide a semiconductor package in which a normally-off transistor and a normally-on transistor are cascode-connected, with delay and ringing suppressed.

While certain embodiments have been described, these embodiments have been presented by way of example only, and are not intended to limit the scope of the inventions. Indeed, the semiconductor device and the semiconductor package described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a normally-off transistor having a first source, a first drain, and a first gate;
a normally-on transistor having a second source electrically connected to the first drain, a second drain, and a second gate;
a first capacitor having a first end and a second end, the second end electrically connected to the second gate;
a first diode having a first anode electrically connected between the second end and the second gate, and a first cathode;
a first resistor electrically connected between the first end and the first gate;
a second diode having a second anode electrically connected to the first end, and a second cathode electrically connected to the first gate, the second diode provided in parallel to the first resistor;
a gate drive circuit electrically connected to the first resistor and the second anode, a wiring being electrically connected to the gate drive circuit and the first source;
a second capacitor having a third end and a fourth end, the third end electrically connected to the wiring and the fourth end electrically connected to the second source; and
a second resistor electrically connected between the wiring and the third end.

2. The semiconductor device according to claim 1, wherein a second capacitance of the second capacitor is equal to or higher than a first capacitance of the first capacitor.

3. The semiconductor device according to claim 1, further comprising:
a third diode having a third anode electrically connected to the second source and a third cathode electrically connected to the fourth end;
a fourth diode having a fourth anode and a fourth cathode electrically connected to the second source;
a third capacitor having a fifth end and a sixth end, the fifth end electrically connected to the wiring, and the sixth end electrically connected to the fourth anode; and
a third resistor electrically connected between the wiring and the fifth end,
wherein the fourth diode, the third capacitor, and the third resistor are provided in parallel to the third diode, the second capacitor, and the second resistor.

4. The semiconductor device according to claim 1, wherein the first cathode electrically connected to the first source.

5. The semiconductor device according to claim 1, wherein the first cathode electrically connected to the second source.

6. A semiconductor package comprising:
a normally-off transistor having a first source, a first drain, and a first gate;
a normally-on transistor having a second source electrically connected to the first drain, a second drain, and a second gate;
a first capacitor having a first end and a second end, the second end electrically connected to the second gate;
a first diode having a first anode electrically connected between the second end and the second gate, and a first cathode;
a first resistor electrically connected between the first end and the first gate;
a second diode comprising a second anode electrically connected to the first end, and a second cathode electrically connected to the first gate, the second diode provided in parallel to the first resistor;
a second capacitor comprising a third end and a fourth end, the fourth end electrically connected to the second source;
a drain terminal electrically connected to the second drain;
a gate terminal electrically connected to the first end, the first resistor, and the second anode;
a first source terminal electrically connected to the first source and a wiring, the wiring being electrically connected to a gate drive circuit, which is electrically connected to the first resistor and the second anode;
a second source terminal electrically connected to the third end; and
a second resistor electrically connected between the first source terminal and the third end.

7. The semiconductor package according to claim 6, wherein a second capacitance of the second capacitor is equal to or higher than a first capacitance of the first capacitor.

8. The semiconductor package according to claim 6, wherein the first cathode electrically connected to the first source.

9. The semiconductor package according to claim 6, wherein the first cathode electrically connected to the second source.

10. The semiconductor device according to claim 1, wherein the second source and the second drain are electrically connected to each other only via the second gate.

11. The semiconductor package according to claim 6, wherein the second source and the second drain are electrically connected to each other only via the second gate.

* * * * *